United States Patent
Mertens et al.

(10) Patent No.: US 6,568,408 B2
(45) Date of Patent: May 27, 2003

(54) METHOD AND APPARATUS FOR REMOVING A LIQUID FROM A SURFACE OF A ROTATING SUBSTRATE

(75) Inventors: Paul Mertens, Haacht (BE); Mark Meuris, Keerbergen (BE); Marc Heyns, Linden (BE)

(73) Assignee: Interuniversitair Microelektronica Centrum (IMEC, vzw), Leuven (BE)

( * ) Notice: Subject to any disclaimer, the term of this patent is extended or adjusted under 35 U.S.C. 154(b) by 0 days.

(21) Appl. No.: 10/097,830

(22) Filed: Mar. 13, 2002

(65) Prior Publication Data

US 2002/0130106 A1 Sep. 19, 2002

Related U.S. Application Data

(60) Division of application No. 09/159,801, filed on Sep. 23, 1998, now Pat. No. 6,491,764, which is a continuation-in-part of application No. 09/022,834, filed on Feb. 13, 1998.
(60) Provisional application No. 60/084,651, filed on May 6, 1998, provisional application No. 60/079,688, filed on Mar. 27, 1998, and provisional application No. 60/059,929, filed on Sep. 24, 1997.

(30) Foreign Application Priority Data

Mar. 20, 1998 (EP) .......................................... 988700563

(51) Int. Cl.[7] ................................................ B08B 3/02
(52) U.S. Cl. .................... 134/95.2; 134/95.3; 134/99.1; 134/144; 134/902
(58) Field of Search ................................ 134/902, 95.2, 134/95.3, 99.1, 102.1, 144, 153

(56) References Cited

U.S. PATENT DOCUMENTS

| | | | |
|---|---|---|---|
| 4,027,686 A | | 6/1977 | Shortes et al. |
| 4,871,417 A | * | 10/1989 | Nishizawa et al. ..... 134/153 X |
| 5,271,774 A | | 12/1993 | Leenaars et al. |
| 5,375,291 A | * | 12/1994 | Tateyama et al. ....... 134/902 X |
| 5,660,642 A | | 8/1997 | Britten |
| 5,873,380 A | | 2/1999 | Kanno |
| 5,887,605 A | | 3/1999 | Lee et al. |
| 5,964,952 A | | 10/1999 | Kunze-Concewitz |

FOREIGN PATENT DOCUMENTS

| | | |
|---|---|---|
| JP | 09162159 | 6/1997 |
| JP | 07211686 | 8/1997 |

* cited by examiner

*Primary Examiner*—Philip Coe
(74) *Attorney, Agent, or Firm*—McDonnell Boehnen Hulbert & Berghoff

(57) ABSTRACT

A method and an apparatus for removing a liquid, i.e a wet processing liquid, from a surface of at least one substrate is disclosed. A liquid is supplied on a surface of substrate. Simultaneously or thereafter besides the liquid also a gaseous substance can be supplied thereby creating at least locally a sharply defined liquid-vapor boundary. The gaseous substance and the liquid can be selected such that the gaseous substance is miscible with the liquid and when mixed with the liquid yields a mixture having a surface tension lower than that of the liquid. According to the invention, the substrate is subjected to a rotary movement at a speed to guide said liquid-vapor boundary over said substrate thereby removing said liquid from said substrate.

30 Claims, 5 Drawing Sheets

Figure 2
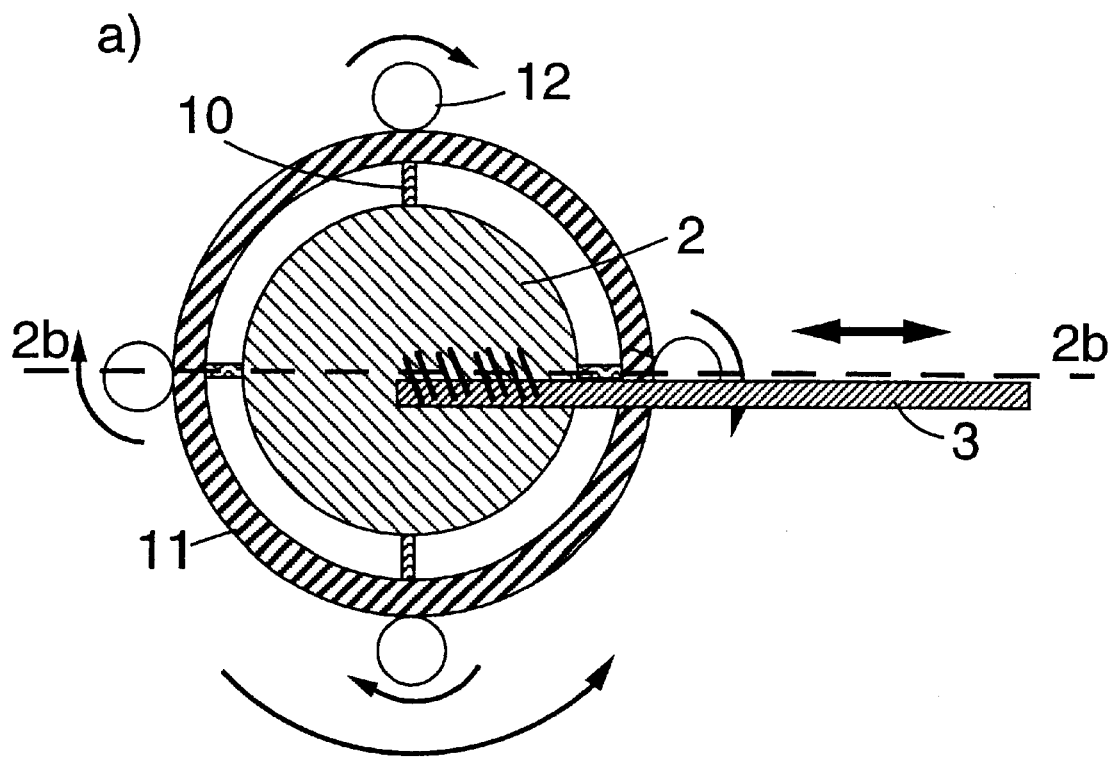
a)
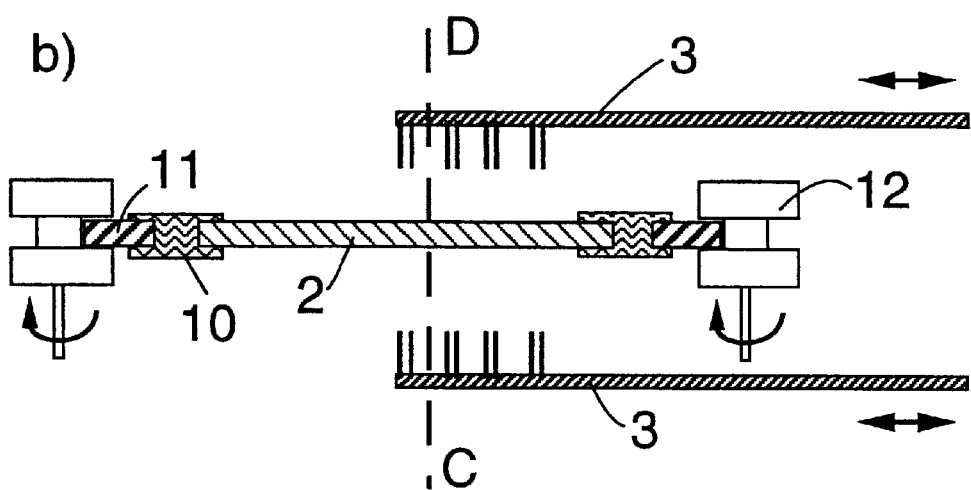
b)

Figure 3
Fig. 3a)
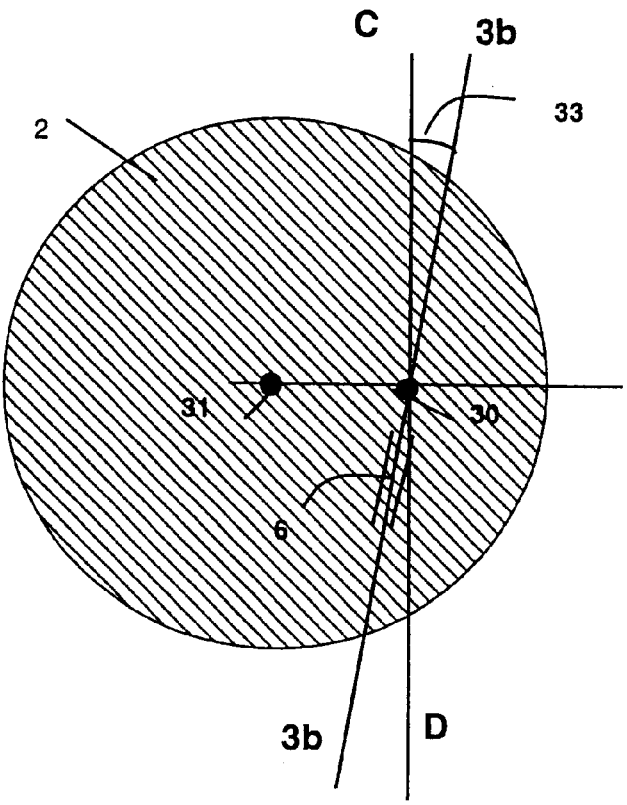
Fig. 3b)
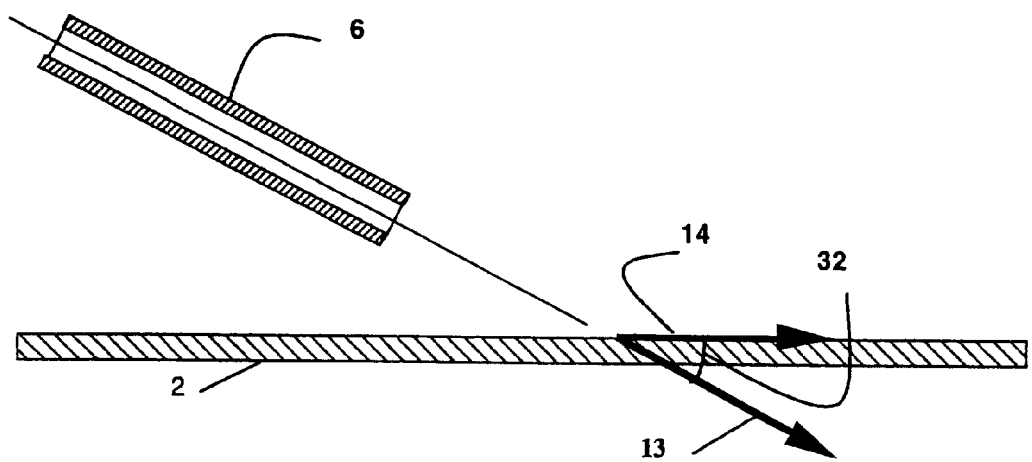

Figure 4
Fig. 4a)
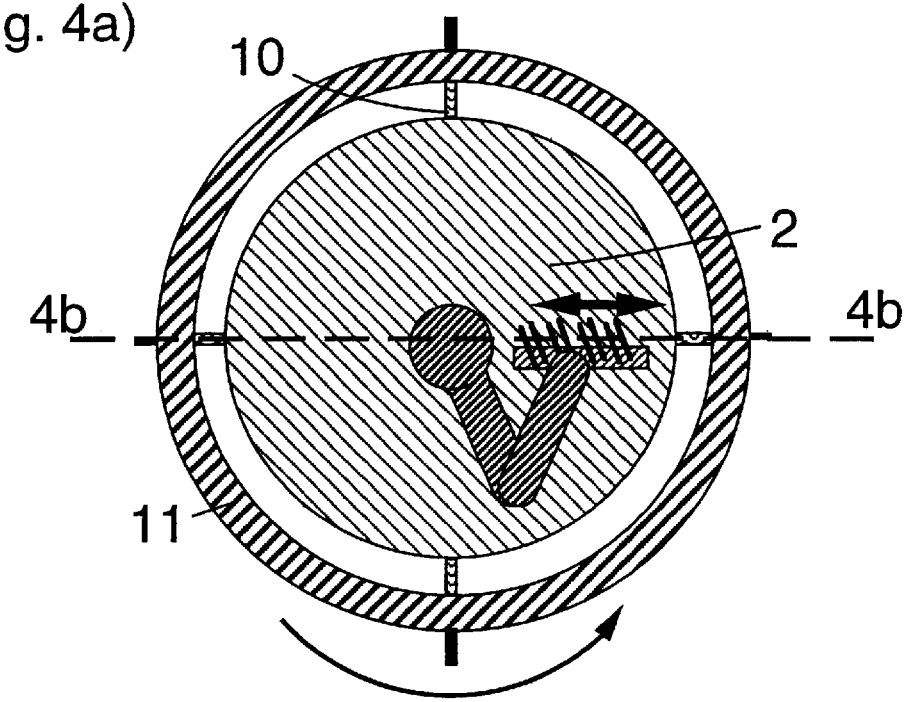
Fig. 4b)
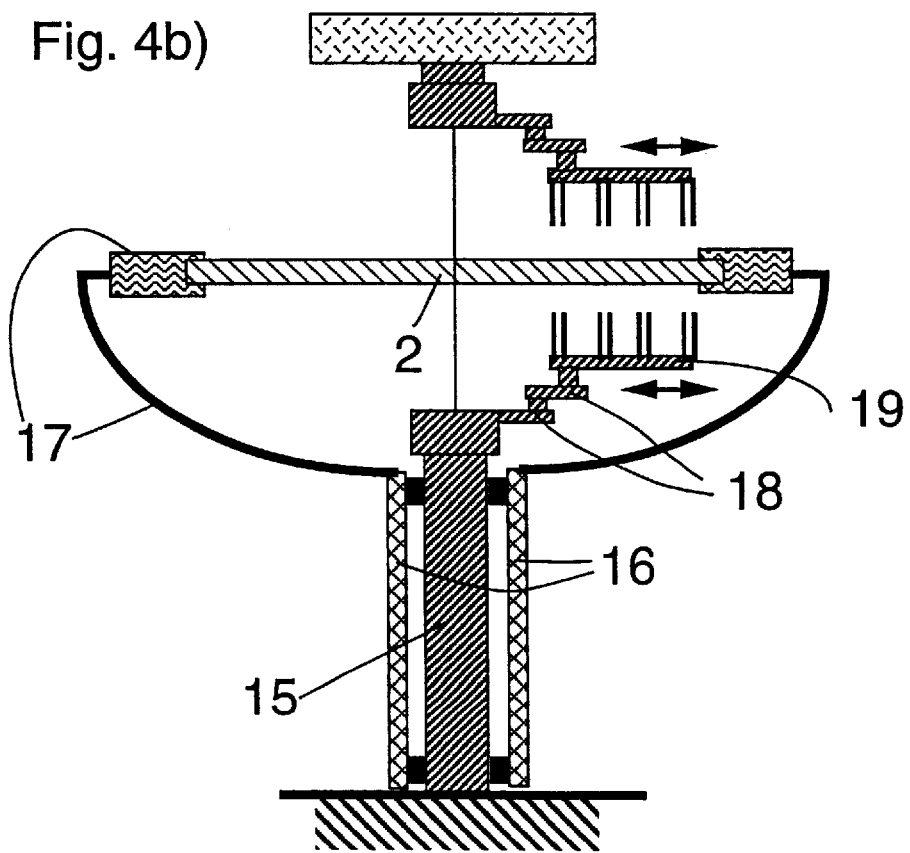

METHOD AND APPARATUS FOR REMOVING A LIQUID FROM A SURFACE OF A ROTATING SUBSTRATE

REFERENCE TO RELATED APPLICATIONS

This application is a divisional of U.S. utility application Ser. No. 09/159,801 filed Sep. 23, 1998, and now U.S. Pat. No. 6,491,764. This which is a continuation-in-part of U.S. utility application Ser. No. 09/022,834 pending filed Feb. 13, 1998 and claims priority benefits to European patent application No. 988700563 filed Mar. 20, 1998, to U.S. provisional application Ser. No. 60/059,929 filed on Sep. 24, 1997, to U.S. provisional application Ser. No. 60/079,688 filed on Mar. 27, 1998, and to U.S. provisional application Ser. No. 60/084,651 filed on May 6, 1998.

FIELD OF THE INVENTION

The present invention is related to an apparatus and a method of removing a liquid from a rotating substrate. This liquid can be any wet processing liquid, as e.g. a wet etching liquid or a cleaning liquid. It can also be a rinsing liquid. The invention is applicable for a number of wet processing steps which are frequently used in the fabrication process of integrated circuits or liquid crystal displays.

BACKGROUND OF THE INVENTION

The complete and efficient removal of a liquid from a surface of a substrate is a multiply repeated step in e.g. the fabrication process of integrated circuits. Such a step can be performed after a wet etching step or a wet cleaning step or a wet rinsing step or any other step used in said fabrication process wherein said substrate is treated or exposed or immersed in a liquid. Said substrate can be a semiconductor wafer or a part thereof or a glass slice or any other slice of an insulating or conductive material.

The manufacturing of integrated circuits evolves towards processing of each substrate individually rather than in batches of several substrates. In state of the art IC manufacturing, most processing steps as e.g. implantation steps, deposition steps are already performed in a single substrate mode. On the other hand, wet processing steps such as e.g. cleaning steps and subsequent liquid removal steps are typically performed in a batch mode because of lack of appropriate alternatives. Therefore, differences in waiting times are created for each individual substrate between a wet processing step, performed in a batch mode and another processing step, performed in a single substrate mode. Such variability is undesirable with regard to process control. Moreover this mixed batch and single substrate processing increases the cycle time, which is also undesirable. Therefore, there is a general interest in the development of competitive single substrate wet processing steps. Particularly, one of the major challenges regarding single wafer wet processing is a method for removing a liquid from both sides of a substrate. There are two major requirements to be fulfilled for such a method. At first the method should work sufficiently fast. Knowing that in state of the art production lines a substrate is processed typically every 2 to 3 minutes, ideally, in order to avoid equipment duplication, the process step and the liquid removal step should be completed in about such a time frame. Another requirement is related to the preferred substrate orientation. State of the art processing equipment and transportation tools are developed to handle substrates in a horizontal position. Therefore in order to avoid additional substrate handling it would be desirable to perform the wet processing steps using horizontally positioned substrates.

In the European Patent EP 0 385 536 B1, a method is disclosed of drying substrates after treatment in a liquid by pulling said substrate slowly out of said liquid. However, this known method, which is based on the Marangoni principle, requires that the substrates are pulled out of the liquid in an upright position, i.e. a surface of said substrate is about perpendicular to the surface of the liquid bath as can be seen in FIGS. 1 to 6 of the European Patent EP 0 385 536 B1. This handling is incompatible with the majority of the other process steps where the equipment and transportation tools are developed to handle horizontal positioned substrates.

In the U.S. Pat. No. 5,271,774 a spin-drying technique is disclosed which is able to handle horizontal positioned substrates. In fact several small liquid islands are formed being removed from the substrate by a rotary movement. It is known that such a spin-drying technique leaves undesirable residues, often referred to as drying marks, on the substrate surface, particularly on surfaces having mixed hydrophilic and hydrophobic regions.

In the U.S. Pat. No. 5,660,642 a liquid removal technique is disclosed wherein a liquid film present on a surface of a substrate can be removed by applying rinsewater together with a surface tension reducing vapor. Particularly, a disadvantage is that regardless of the precise nature of the liquid, during the liquid removal process always rinsewater is supplied. Furthermore, the surface tension reducing vapor is passively applied, e.g. by natural evaporation, which makes it difficult to locally, i.e. at moving zone, have a good and efficient control on the vapor supply or to direct the vapor. Moreover U.S. Pat. No. 5,660,642 does not disclose how to remove a liquid film substantially simultaneously from two opposite surfaces, i.e. top and bottomside, of a horizontally positioned substrate. Neither does U.S. Pat. No. 5,660,642 disclose how to remove efficiently a liquid from the topside of a horizontally positioned substrate.

SUMMARY OF THE INVENTION

In an aspect of the invention a method of removing a liquid from at least one surface of at least one substrate is disclosed, said method comprising the steps of:

supplying a liquid on at least a part of said surface of said substrate;

supplying a gaseous substance to said surface of said substrate, said gaseous substance being at least partially miscible with said liquid and when mixed with said liquid yielding a mixture having a surface tension being lower than that of said liquid; and subjecting said substrate to a rotary movement. Said gaseous substance can comprise a vaporised substance which is miscible with said liquid and when mixed with said liquid yields a mixture having a surface tension being lower than that of said liquid. Said gaseous substance can comprise a gas which is miscible with said liquid and when mixed with said liquid yields a mixture having a surface tension being lower than that of said liquid. Said gaseous substance can comprise a mixture of a vaporised substance and a gas, like e.g. helium, argon or nitrogen, said mixture being at least partially miscible with said liquid and when mixed with said liquid yielding a mixture having a surface tension being lower than that of said liquid. Particularly, by supplying said liquid and said gaseous substance on said surface of said substrate, at least locally a sharply defined boundary is created between the liquid and the gaseous substance, i.e. a so-called liquid-vapor boundary.

In an embodiment of the invention, said rotary movement is performed at a speed to guide said liquid-vapor boundary over said substrate. Preferably this boundary is a curved boundary. The configuration is such that the liquid is kept at the outside of the curved boundary, i.e. at the liquid side of the liquid-vapor boundary. In an embodiment of the invention the substrate can spin around its own axis. Alternatively said substrate can also be subjected to a rotary movement where said substrate no longer spins around its own centre.

In another embodiment of the invention, a method of removing a liquid from at least one surface of at least one substrate is disclosed, comprising the steps of:

supplying said substrate to a rotary movement supplying a liquid to at least a part of said surface of said substrate; and supplying a gaseous substance to said surface of said substrate while supplying said liquid, said gaseous substance being at least partially miscible with said liquid and when mixed with said liquid yielding a mixture having a surface tension being lower than that of said liquid. Particularly on at least a part of the surface of the substrate, fresh liquid is sprayed continuously. The entire surface at the liquid side of the liquid-vapor boundary can be covered, as e.g. for hydrophilic surfaces, with a continuous film of the liquid. The speed of the rotary movement is chosen such that the flow of said sprayed liquid on at least one side of the wafer is transported outwards due to the centrifugal forces. Moreover, said gaseous substance, when mixed with said liquid yields a mixture having a surface tension being lower than that of said liquid. The resulting surface tension reduction of said liquid facilitates the movement of said liquid towards an edge of the substrate. The surface left behind is cleaned and dried. It is presumed that this drying action is obtained according to at least the combination of the rotary movement and the Marangoni effect. According to the Marangoni effect said substances will be mixed with the liquid such that in the liquid meniscus, its concentration decreases in the direction of the liquid. This gradient in concentration creates an additional force exerted on the liquid film in the direction of the liquid film resulting in a good drying performance.

The liquid is selected dependent upon the applied wet processing step like e.g. a wet etching step or a cleaning step or a rinsing step. To initiate the drying process, besides said liquid also a gaseous substance reducing the surface tension of said liquid is sprayed on at least one surface of said substrate. Particularly, a pressurized gaseous substance is actively supplied e.g. by using at least one nozzle, said nozzle preferably being movable. Alternatively, instead of a movable nozzle, at least one static inlet can be used for supplying, preferably actively, said gaseous substance on said surface of said substrate. Said surface tension reducing gaseous substance can be isopropyl alcohol (IPA), but also any other gaseous substance which is miscible with said liquid and which will form a mixture with said liquid having a surface tension lower than that of said liquid alone, can be used. Particularly, said gaseous substance may be heated at a temperature typically in the range between 20 and 100 degrees Celsius.

In another embodiment of the invention, eventually prior to the liquid removal step an etching, a cleaning or a rinsing liquid or a sequence of such liquids can be supplied to the entire surface of a rotating substrate. Particularly prior to the liquid removal step of the present invention, a liquid comprising water, ozone and an additive acting as a scavenger can be dispensed on a surface of a rotating substrate in order to remove organic contaminants from said surface. Preferably said liquid is maintained at a temperature below the boiling point of said liquid. The parameters can be optimized such that a liquid film can completely cover a surface. The spinning motion will quickly transport the liquid over the surface towards the edge, thus allowing relatively short carry-over transients and thus also allowing for relatively short rinsing times. Using such a continuously switched flow of liquids eliminates the undesirable passage of liquid-gas interfaces over the surface. The liquid removal method of the present invention is applicable for each sequence of at least one wet processing step by supplying a surface tension reducing gaseous substance together with the liquid. The drying can thus be applied directly on the processing liquid if relevant for the application. Since the proposed drying technique is found to be very fast, process non-uniformity over the surface can be kept very low.

In another embodiment of the invention, eventually prior to the liquid removal process of the present invention, a gas mixture comprising water vapor, ozone and an additive acting as a scavenger can be supplied on a surface of a substrate in order to remove the organic contaminants from said surface. This action is usually followed by a wet processing step, i.e. a rinsing step.

In another embodiment of the invention, another force can be combined with the liquid removal process of the present invention. Particularly, by using megasonic energy as said other force to agitate the liquid applied during the removal process the cleaning performance of said liquid removal process can be enhanced. Doing so can help in particle reduction. Alternatively also contacting a surface with a rotating cleaning pad is an example of such other force.

In an aspect of the invention an apparatus for removing a liquid from at least one surface of at least one substrate is disclosed, said apparatus comprising:

a substrate holder which is subjectable to a rotary movement, said substrate being releasably held by said substrate holder;

a liquid supply system for applying a liquid on at least part of said surface of said substrate;

a gaseous substance supply system for applying a gaseous substance on said surface of said substrate. Preferably, said gaseous substance supply system and said liquid supply system are positioned such that said gaseous substance is applied closer to the centre of said rotary movement of said substrate holder than said liquid. Particularly said liquid supply system is movable relative to said substrate holder.

In an embodiment of the invention, said apparatus further comprises a chamber, preferably pressurizable, wherein said substrate holder is positioned. This chamber is designed in a manner to avoid back splashing of the liquid removed from a surface onto said surface. For instance, a chamber having slanted walls may be used. Particularly, the substrate holder may be positioned horizontally in said chamber. In such case, preferably the vertical walls of said chamber are oriented such that the angle between said walls and the horizontally positioned substrate holder is smaller than 90 degrees in order to prevent back splashing of the liquid which is removed according to the method of the present invention.

In another embodiment of the invention, said apparatus further comprises a generator of megasonic energy and a transmitter for transmitting said megasonic energy to a surface of the substrate via the liquid being supplied at said surface.

In another embodiment of the invention, the gaseous substance supply system can comprise at least one nozzle for applying said gaseous substance on said surface of said substrate and said liquid supply system can comprise at least one nozzle for applying said liquid on said surface of said substrate, said nozzles are positioned such that said gaseous substance is actively applied closer to the centre of the rotary movement of the substrate holder than said liquid. Particularly, at least locally a sharply defined liquid-vapor boundary can be created which is located inbetween a first and a second adjacent nozzle, said first nozzle being part of said gaseous substance supply system, said second nozzle being part of said liquid supply system. Further according to the apparatus of the invention, said nozzles can be mounted on an arm, said nozzles being movable on said arm and/or said arm being movable relative to said substrate holder.

In another embodiment of the invention, the gaseous substance supply system comprises at least one static inlet for applying said gaseous substance on said surface of said substrate and the liquid supply system comprises at least one nozzle for applying said liquid on said surface of said substrate. Particularly, at least locally, a sharply defined liquid-vapor boundary can be created being located between the rotation centre and the liquid supply nozzle being located at the shortest radial distance from the rotation centre. Further according to the apparatus of the invention, said liquid nozzles can be mounted on an arm, said nozzles being movable on said arm and/or said arm being movable relative to said substrate.

BRIEF DESCRIPTION OF THE DRAWINGS

FIG. 2a) depicts a schematic representation, i.e. a top view, while FIG. 2b) depicts a cross-section (2b—2b) of a tool used for removing a liquid from a rotating substrate according to an embodiment of the invention.

FIG. 3a) depicts a top view of the cross-sectional plane (C–D of FIG. 2b)) perpendicular to the surface of the substrate through the point of liquid impingement (30) and perpendicular to the imaginary line connecting the point of liquid impingement and the rotation centre (31) of a tool used for removing a liquid from a rotating substrate according to an embodiment of the invention. The vector representing the velocity of the liquid leaving the nozzle is in this cross-sectional plane (C–D) or in a plane (3b—3b) perpendicular to the surface of the substrate making a small angle (33) with (C–D), i.e. the liquid velocity vector can be slightly oriented outwards. FIG. 3b) depicts the 3b—3b plane.

FIG. 4a) depicts a schematic representation, i.e. a top view, while FIG. 4b) depicts a cross-section (4b—4b) of a tool used for removing a liquid from a rotating substrate according to an embodiment of the invention.

DETAILED DESCRIPTION OF THE INVENTION

Figure 1:
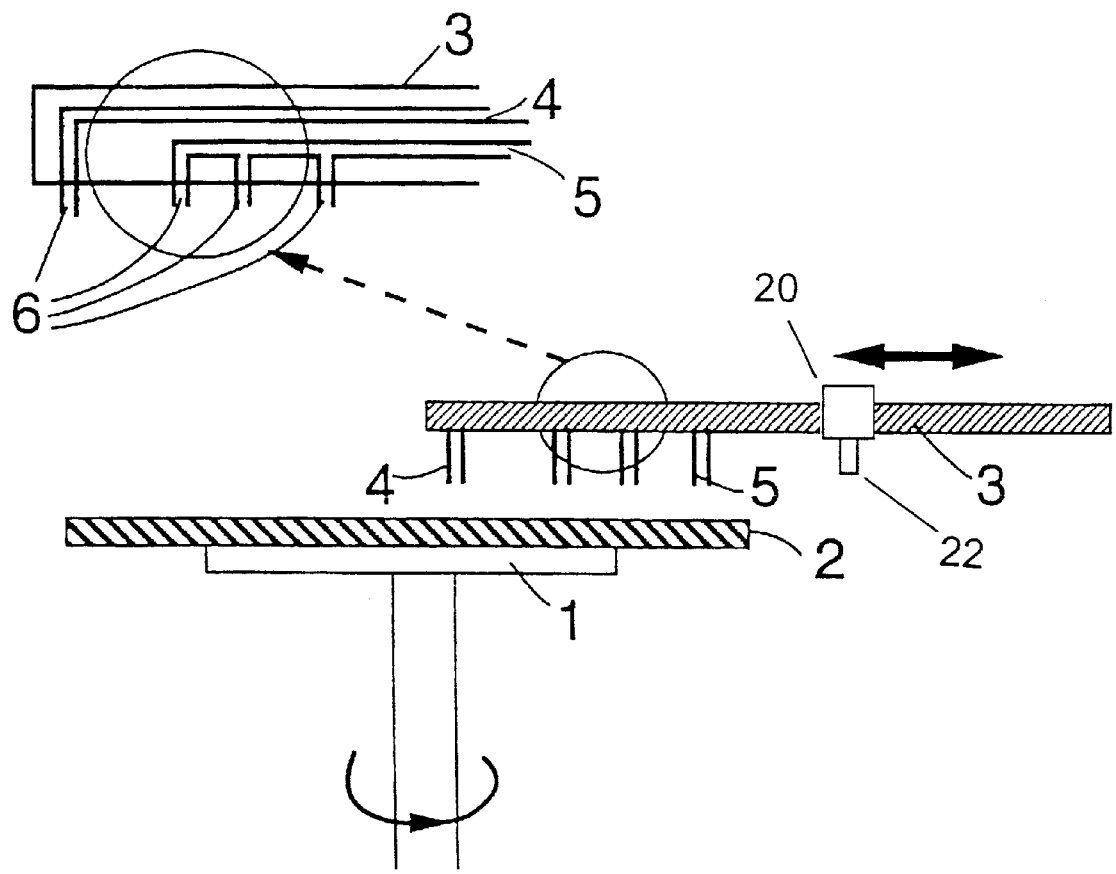
FIG. 1 depicts a schematic representation (vertical cross-section) of a tool used for removing a liquid from the topside of a surface of a rotating substrate according to an embodiment of the invention.

In relation to the appended drawings the present invention is described in detail in the sequel. Several embodiments are disclosed. It is apparent however that a person skilled in the art can imagine several other equivalent embodiments or other ways of executing the present invention, the spirit and scope of the present invention being limited only by the terms of the appended claims.

In an aspect of the invention a method of removing a liquid from at least one surface of at least one substrate is disclosed, said method comprising the steps of:

supplying a liquid on at least a part of said surface of said substrate;

supplying a gaseous substance to said surface of said substrate, said gaseous substance being at least partially miscible with said liquid and when mixed with said liquid yielding a mixture having a surface tension being lower than that of said liquid; and subjecting said substrate to a rotary movement. Said gaseous substance can comprise a vaporised substance which is miscible with said liquid and when mixed with said liquid yields a mixture having a surface tension being lower than that of said liquid. A vaporised substance is defined as a mist of finely dispersed liquid droplets of an element or a compound or a mixture of elements or as a vapor. A vapor is defined as the gas phase occurrence of an element or of a compound or of a mixture of elements if the element or compound or mixture should be in the liquid or solid phase at the given temperature and pressure conditions. Thus a vapour can co-exist in one environment with the solid or liquid phase of the element. A vapour is a specific gas phase occurrence of an element or a compound or a mixture of elements. Said gaseous substance can comprise a gas which is miscible with said liquid and when mixed with said liquid yields a mixture having a surface tension being lower than that of said liquid. Said gaseous substance can comprise a mixture of a vaporised substance and a gas, particularly an inert gas like e.g. helium, argon or nitrogen, said mixture being at least partially miscible with said liquid and when mixed with said liquid yielding a mixture having a surface tension being lower than that of said liquid. Particularly, by supplying said liquid and said gaseous substance on said surface of said substrate, at least locally a sharply defined liquid-vapor boundary is created. Said boundary has to be such that, at least within the part of the surface which is not rewetted during a subsequent revolution, said boundary is a continuous one, i.e. said part is determined by the lateral movement of said boundary during a revolution. According to the method of the present invention, said rotary movement is performed at a speed to guide said liquid-vapor boundary over said substrate. The configuration is such that the liquid is kept at the liquid side of the liquid-vapor boundary.

According to this method of the invention, on at least one surface, preferably on both opposite surfaces simultaneously i.e. the top and bottomside, of at least one substrate fresh liquid is sprayed continuously. The entire surface at the liquid side of the liquid-vapor boundary can be covered with a film of the liquid. The speed of the rotary movement is chosen such that the flow of said sprayed liquid on said surface of the wafer is transported outwards due to the centrifugal forces. The rotational speed, the flow of the liquid supply, and the orientation and the velocity at which the liquid arrives on the surface can be optimized in order to result in a liquid film with a sharp and stable liquid-vapor boundary and to keep the thickness of the liquid film small enough to avoid excessive losses of liquid on the bottomside by gravitational forces. Moreover, said gaseous substance when mixed with the liquid, results in a surface tension reduction of said liquid thereby facilitating the movement of said liquid towards an edge of the substrate. The surface left behind is cleaned and dried. It is presumed that this drying action is obtained according to at least the combination of the Marangoni effect and a second force. Preferably this second force is the force introduced by a rotary movement or e.g. an oscillating movement. According to the Marangoni effect said substances will be mixed with the liquid such that in the liquid meniscus, its concentration decreases in the direction of the liquid. This gradient in concentration creates an additional force exerted on the liquid film in the direction of the liquid film resulting in a good drying performance. Particularly, the centre of the rotary movement can coincide with the centre of the substrate, i.e. the substrate spins around its own centre. In this case, if a liquid is sprayed on a surface of a substrate rotating typically with a speed between 2 and 20 revolutions per second, but the invention is not limited thereto, a curved shaped liquid-vapor boundary is created. The entire surface area outside of this curved boundary, can be covered with a film of the liquid. Particularly when using hydrophilic substrates, the entire surface area outside of this curved boundary is covered with a continuous film of the liquid However also other more complex shaped boundaries can be created, particularly on substrates with a high contact angle for the liquid and if a low flow of liquid is applied. Such complex shaped boundaries will also assist in removing a liquid.

The liquid is selected dependent on the applied wet processing step: for etching steps, e.g. dilute aqueous solutions comprising e.g. HF can be used; for cleaning steps, e.g. a mixture of $NH_4OH$, $H_2O_2$ and $H_2O$ or a mixture of HCl, $H_2O_2$ and $H_2O$ or dilute HCl or a mixture comprising $O_3$ can be used; for rinsing steps, the rinsing liquid can comprise $H_2O$, or a mixture of $H_2O$ and an acid, said mixture preferably having a pH between 2 and 6. Preferably said acid is one of the group of $HNO_3$, $H_2CO_3$, $HCO_3$, HCl, HBr, $H_3PO_4$, $H_2SO_4$. To initiate the removal process, besides said liquid also a gaseous substance is sprayed on at least one surface of said substrate. Said gaseous substance can comprise a substance, like e.g. isopropyl alcohol (IPA), diacetone, ethyllactate, ethylglycol, methylpyrrolidon or a mixture of one of the aforementioned substance, which when vaporised is miscible with said liquid and when mixed with said liquid yields a mixture having a surface tension being lower than that of said liquid There are several implementations possible to apply both the liquid and the vapor of the surface tension reducing substance on at least one surface of at least one substrate. Preferably the implementation has to be such that the gaseous substance is supplied initially at or very close to the centre of the rotary movement, while the liquid is supplied out of centre but adjacent to the gaseous substance supply. The liquid can also be additionally supplied further away from said centre. By doing so on said surface of said substrate a liquid-vapor boundary can be formed which is initially located at said centre. Then, due to the rotary movement and the movement of the gaseous substance and liquid supply system, this boundary is slowly guided outwards from the centre to the edge to thereby remove the liquid or the solution of said liquid from said surface of said substrate. A sharply defined liquid-vapor boundary, at least locally, is helpful in order to obtain an optimal performance. The method of the present invention is perfectly suited to handle a horizontal positioned substrate resulting in a secure and reliable approach which is compatible with substrate handling in most of the other process steps in the manufacturing of integrated circuits. Moreover because, according to the present invention, the liquid of the liquid-vapor boundary is continuously refreshed, besides a good drying performance also a better cleaning performance is obtained simultaneously. A better cleaning performance can be obtained regardless of the precise nature of the liquid, i.e. a wet processing liquid like e.g. a cleaning liquid or a rinsing liquid or a wet etching liquid, as long as the liquid is miscible with the surface tension reducing gaseous substance. Particularly said liquid can be a dilute aqueous solution. Furthermore the required amounts of liquid are substantially lower compared with conventional wet processing baths or tanks.

According to the method of the present invention first the liquid can be supplied on a surface of a substrate at or very close to the centre of the rotary movement, while there is no gaseous substance supply. Then, the liquid supply is moved slightly out of said centre and the gaseous substance is supplied at said centre.

Further according to the method of the present invention first the liquid can be supplied on a surface of a substrate at or very close to the centre of the rotary movement, while substantially simultaneously the gaseous substance is supplied adjacent to said liquid supply. Then, the liquid supply is moved slightly out of said centre, while the gaseous substance supply is moved to said centre. Once a liquid-vapor boundary is established, at least locally, both the liquid supply and the gaseous substance supply are moved such that the liquid-vapor boundary is guided outwards.

In another embodiment of the invention the centre of the rotary movement coincides with the centre of the substrate, i.e. the substrate rotates around its own centre. Then the gaseous substance supply system, e.g. a nozzle is moved to the centre of the rotary movement, i.e. the centre of the substrate, and the pressurised gaseous substance is supplied actively at said centre while the liquid is supplied slightly out of centre. The liquid can also be supplied further away from said centre. By doing so on said surface of said substrate a liquid-vapor boundary is formed which is initially located at said centre. Then, due to the rotary movement and the movement of the gaseous substance and liquid supply system, this boundary is slowly guided outwards from the centre to the edge of said surface of said substrate to thereby remove the liquid or the solution of said liquid from said surface of said substrate.

In another embodiment of the invention, in order to enhance the cleaning performance of the liquid removal process of the present invention, an additional force can be exerted on the liquid, particularly on the liquid near the liquid-vapor boundary. Particularly, said liquid can be agitated by using megasonic energy. This megasonic energy can be generated locally by a generator and transmitted to the liquid. Particularly, said generator can be integrated in the liquid supply system and directly transmitting the megasonic energy to the liquid. Then, this megasonic energy is transferred to the surface of the substrate via the liquid. In an implementation a megasonic liquid nozzle or jet is used. This megasonic liquid nozzle consist of a liquid nozzle 22 and generator 20, as shown in FIG. 1. The liquid which is dispensed on the surface by this megasonic liquid nozzle 22 is agitated by means of said generator 20. Because there is a continuous flow between the megasonic liquid nozzle 22 and the surface, the megasonic energy is transferred to the surface via the liquid to thereby enhance the cleaning performance of the liquid. This megasonic liquid nozzle 22 can be mounted on an arm together with a gaseous substance supply nozzle. In another implementation, a megasonic arm can be used. This megasonic arm consists of a megasonic generator and a liquid supply system. Particularly said megasonic generator comprises a transducer and a transmitter. Preferably this transmitter has a cylindrical shape and extends along said arm. Said megasonic arm extends over a surface of a substrate, preferably close to said surface. Liquid can be supplied to said surface of the substrate. This liquid is confined between said surface and said arm. So again the megasonic energy can be transmitted to the liquid by means of the transmitter and subsequently via said liquid to the surface of the substrate. Preferably, to maximize the capillary effect during the liquid removal process of the present invention, the distance between the arm and the surface of the substrate is about 0.5 mm or less, but the invention is not limited thereto.

In an aspect of the invention an apparatus for removing a liquid from at least one surface of at least one substrate is disclosed, said apparatus comprising:

a substrate holder (1) (11) which is subjectable to a rotary movement, said substrate (2) being releasably held said substrate holder;

a liquid supply system (5) for applying a liquid on at least a part of said surface of said substrate;

a gaseous substance supply system (4) for applying a gaseous substance on said surface of said substrate, and where said gaseous substance supply system and said liquid supply system are positioned such that said gaseous substance is applied closer to the centre of said rotary movement of said substrate holder than said liquid.

In an embodiment of the invention, as illustrated in FIG. 1, a substrate (2) is placed on a revolving substrate holder (1). Said substrate can be placed in a chamber of a tool comprising at least one chamber. Said substrate holder and the substrate thereon are rotating with a speed which is typically between 2 and 20 or more revolutions per second. A movable arm (3), which can be guided between the centre and the edge of the substrate extends above the topside of the substrate. Initially one end of this arm is located near the centre of the rotary movement, i.e. the centre of the substrate. Said arm comprises at least two supply systems, a first supply system comprising means (4) for supplying a surface tension reducing gaseous substance to the substrate, a second supply system comprising means (5) for supplying a liquid to the substrate. Said first supply system further comprises at least one nozzle, initially being placed at or near the centre of the substrate, for spraying said gaseous substance on said substrate. Said second supply system further comprises at least one nozzle, being placed more outwards than said nozzle for spraying gaseous substance, for spraying said liquid on said substrate. Alternatively, instead of a movable arm comprising fixed nozzles also movable nozzles on a fixed arm can be used. To ensure that each part of the substrate is effectively dried, the translation speed, v, at which the arm, i.e. the nozzles, moves can be adapted to the rotational (angular) speed, ω, of the substrate. Suppose that Δr is the translation distance, being the radial distance over which the liquid-vapor boundary extends radialy during one revolution, then the rotational speed can be chosen such that:

$$\Delta r = \frac{2\pi v}{\omega}$$

For example, suppose that the translation distance per revolution, Δr, equals 1 mm and that the translation speed, v, equals 1 mm per second, then the rotational speed is 1 revolution per second.

In tests, the nozzles are located such that their centre lines will draw concentric circles on the surface with a difference in radius on the order of 5 mm. By doing so, at the topside of the substrate a curved liquid-vapor boundary is formed which is initially located at said centre of the substrate. Then this boundary is slowly guided outwards by moving said arm (3) from the centre to the edge of the substrate to thereby remove the liquid or the solution of said liquid from the topside of said substrate. The liquid-vapor boundary is located in between the nozzle providing the surface tension reducing gaseous substance and the nearest nozzle spraying the liquid. Using this method fresh liquid with very low concentration of the surface tension reducing gaseous substance is supplied at the liquid-vapor boundary thus maximizing the removal of the liquid (maximizing Marangoni force). In FIG. 1 the nozzles (6) are placed such that the gaseous substance is sprayed perpendicular, i.e. at an angle of 90°, on the substrate and also the liquid is sprayed on the substrate. Spraying the liquid can be done such that at least locally a sharp and stable curved boundary is obtained, and particularly in case hydrophilic substrates are used the entire surface of the substrate at the outerside of the boundary is kept wet. This will involve optimization of the orientation of the liquid nozzle(s) and of the velocity of the liquid leaving the nozzle. In order to limit splashing of the liquid the angle (32) between the velocity vector of the liquid (FIG. 3 (13)) when leaving the nozzle and the velocity vector of the rotating surface (FIG. 3 (14)) at the point (30) where the liquid flow impinges can be kept small. Eventually, the liquid nozzles can also be slightly oriented outwards, i.e. typically at an angle (33) between 0 degrees and 5 degrees. For removing a liquid having a low contact angle in contact with the surface, it is found sufficient to have only one nozzle for supplying the liquid. In case of higher contact angles, in order to maintain a wet substrate surface outside the drying boundary, additional nozzles for spraying liquid can be installed at equal or greater distance from the rotation centre (31). In order to further limit the consumption of the liquid the additional nozzles can be turned off as they move over the substrate edge. It may be useful to progressively modulate the flow and the rotation speed as the drying proceeds from the centre towards the edge of the substrate.

According to this embodiment of the invention, as an example, experiments are performed using such an apparatus for removing a liquid from the topside of a substrate. Particularly, the gaseous substance supply system of said apparatus comprises one nozzle and the liquid supply system of said apparatus also comprises one nozzle. Said nozzles are mounted on an arm, said arm being movable relative to said substrate. The substrates used in the experiments are silicon wafers with a diameter of 150 mm with a deposited oxide layer on top. The thickness of the oxide layer is 1.1 μm. The wafers are polished by means of chemical mechanical polishing. After this treatment, the thickness of the remaining oxide layer is 700 nm. Immediately thereafter the wafers are put in a water container.

In a first test a state of the art method is used to remove the water from the topside of a wafer. The wafer is placed on a substrate holder and subjected to a rotary movement at a speed of 600 revolutions per minute during 40 seconds while only a surface tension reducing gaseous substance, i.e. a mixture of vaporised isopropyl alcohol (IPA) and nitrogen, is supplied. The experiment is performed in a class 10000 cleanroom area. After this removal treatment light point-defects (LPD's), being a measure for the number of contamination particles, are measured using a Tencor Surfscan 6400. The number of LPD's per wafer measured with a polystyrene latex sphere equivalent (PSLSE) diameter between 0.2 and 0.3 μm is 309 with a standard deviation of 113. These numbers are an average of LPD measurements on two different wafers which were subjected to the same treatment according to this first experiment.

In a second test, according to this embodiment of the present invention a method is used to remove the water from the topside of a wafer. The wafer is placed on a substrate holder and subjected to a rotary movement at a speed of 600 revolutions per minute during 15 seconds or 25 seconds. A pressurized surface tension reducing gaseous substance, i.e. a mixture of vaporised isopropyl alcohol (IPA) and nitrogen, is actively supplied by the first nozzle, while a liquid, i.e. fresh water, is actively supplied by the second nozzle. The arm comprising the nozzles is moved from the centre to the edge with a radial velocity of 5 mm per second or 3 mm per second. The experiment is performed outside a cleanroom area. After this removal treatment light point-defects (LPD's), being a measure for the number of contamination particles, are measured using a Surfscan 6400. The number of LPD's per wafer measured with a PSLSE diameter between 0.2 and 0.3 $\mu$m is 14 with a standard deviation of 5. These numbers are an average of LPD measurements on six different wafers, 3 which are subjected to the same treatment, i.e. with a radial velocity of 5 mm per second, and the other three wafers which are also subjected to the same treatment, i.e. with a radial velocity of 3 mm per second according to this second experiment. From the LPD measurements it is clear that the method of the present invention has a better cleaning and drying performance, particularly with regard to particles.

In an embodiment of the invention, as illustrated in FIG. 2, a substrate (2) can be clamped into a ring-shaped substrate holder (11) having an inner diameter larger than the diameter of the substrate. The clamping is done using minimal contact surface. The substrate holder or alternatively the substrate itself is placed between at least two revolving means (12) which transmit the rotational force to said substrate holder comprising the substrate or alternatively to said substrate alone. Said substrate holder comprising said substrate or said substrate alone can be placed in a chamber of a tool comprising at least one chamber. Said substrate is rotating with a speed which is typically between 2 and 40 revolutions per second, or between 1 and 100 revolutions per second, or between 10 and 60 revolutions per second. Two movable arms (3), which can be guided separately or simultaneously between the centre and the edge of the substrate extend above the topside and below the bottomside of the substrate. Initially one end of each of these arms is located near the centre of the substrate. Each of these arms comprises at least two supply systems, a first supply system comprising means (4) for supplying a surface tension reducing gaseous substance to the substrate, a second supply system comprising means (5) for supplying a liquid to the substrate. Said first supply system further comprises at least one nozzle, being placed near the centre of the substrate, for spraying said gaseous substance on said substrate. Said second supply system further comprises at least one nozzle, being placed more outwards than said nozzle for spraying gaseous substance, for spraying said liquid on said substrate. By doing so both at the topside and on the bottomside of the substrate a liquid-vapor boundary can be formed which is located at said centre of the substrate. Then this boundary is slowly guided outwards by moving said arms (3) from the centre to the edge of the substrate to thereby remove the liquid or the solution of said liquid from the surfaces of said substrate. In order to limit splashing of the liquid the angle between the velocity of the liquid (FIG. 3 (13)) when leaving the nozzle and the velocity of the rotating surface (FIG. 3 (14)) at the point where the liquid flow impinges can be kept small.

Another approach for building this rotation system is shown in FIG. 4. In this case, at the bottomside is, a set of arms (18) with a bar of nozzles (19) attached thereon at the bottomside is mounted on a central shaft (15). Around this shaft a hollow shaft (16) is rotating. On this hollow shaft the clamping means (17) of the substrate are fixed. The set of arms moving over a radius of the substrate comprises at least a first arm and a second arm and can be made compact, i.e. like a man's arm. Said first arm is connected to said shaft to rotate about a first axis orthogonal to and through the rotation centre of the substrate holder. Said second arm is parallel to but offset from the first arm with the first arm and the second arm being rotatably connected at a joint to rotate about an axis parallel to the first axis. The set of arms on the topside can be similar, but no rotation gear is required at the topside.

Figure 5:
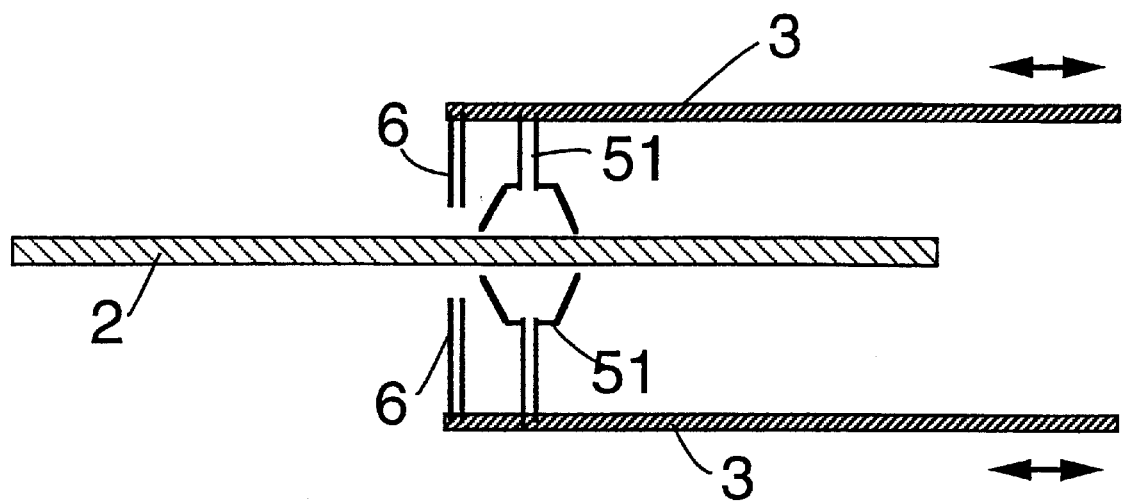
FIG. 5 depicts a vertical cross-section of an implementation of a tool according to an embodiment of the invention.

In an embodiment of the invention (FIG. 5), the liquid supply system (3) comprises a cup-shaped nozzle (51) which can be guided over the rotating substrate(2) and which is positioned very close to a surface of a substrate. Particularly, the distance between this cup-shaped nozzle and a surface of the substrate is typically about 0.5 mm. The liquid, e.g. water, can be supplied through the cup.

In another embodiment of the invention, said apparatus further comprises a generator of megasonic energy and a transmitter for transmitting said megasonic energy to a surface of the substrate via the liquid being supplied at said surface. In particular a megasonic liquid jet or a megasonic arm can be used In another embodiment of the invention, the gaseous substance supply system comprises at least one static inlet for applying said gaseous substance on said surface of said substrate and the liquid supply system comprises at least one nozzle for applying said liquid on said surface of said substrate. Particularly, at least locally, a sharply defined liquid-vapor boundary can be created being located between the rotation centre and the liquid supply nozzle being located at the shortest radial distance from the rotation centre. Further according to the apparatus of the invention, said liquid nozzles can be mounted on an arm, said nozzles being movable on said arm and/or said arm being movable relative to said substrate.

In further tests, according to the method of the invention, the nozzles are positioned in order to draw concentric circles on the surface with a difference in radius in the order of 6 mm. One nozzle is provided to spray the liquid, i.e. $H_2O$ on a surface of a 150 mm silicon wafer. The rate of the liquid flow is about 60 ml per minute. The surface tension reducing gaseous substance used is a mixture of vaporised IPA and a nitrogen gas. The rotation speed is about 300 revolutions per minute. These conditions are suited to remove the liquid very efficiently for hydrophilic wafers. It is found that particularly for hydrophobic silicon wafers, it is important to have a sufficiently high liquid supply to keep the outer parts of the wafer wet. Preferably additional nozzles can be provided to ensure this.

According to the method of the present invention, the same rotation station can be used to perform a wet chemical processing step like e.g. a wet etching step, wet cleaning and rinsing a substrate, or to perform an arbitrary sequence of such wet processing steps. In an embodiment of the invention, prior to the initiation of the liquid removal process, i.e. prior to supplying a surface tension reducing gaseous substance, an etching, cleaning or rinsing liquid or a continuous sequence of such liquids can be supplied to at least one surface of the substrate. Particularly prior to the liquid removal step of the present invention, a liquid comprising water, ozone and an additive acting as a scavenger can be dispensed on a surface of a rotating substrate in order to remove organic contaminants from said surface. A scavenger is defined as a substance which can be added to a mixture or any other systems such as liquid, gas, solution in order to counteract the unwanted effects of other constituents of the mixture or system. For instance, this can be done by using at least one of the liquid nozzles (and eventually additional nozzles further away from the centre). The parameters can be optimized such that a continuous liquid film is present on the surface. The spinning motion will quickly transport the liquid over the surface towards the edge, thus allowing relatively short carry-over transients and thus also allowing for relatively short rinsing times. Using such a continuously switched flow of liquids eliminates the passage of liquid-gas interfaces over the surface. The liquid removal method of the present invention is applicable for each sequence of at least one wet processing step by supplying a surface tension reducing gaseous substance together with the liquid. The removal method can thus be applied directly on the processing liquid if beneficial for the application. Since the proposed removal method is found to be very fast, process non-uniformity over the surface, i.e. centre to edge or edge to edge, can be kept very low.

What is claimed is:

1. An apparatus for removing liquid from at least a first side of at least one substrate, said apparatus comprising:
   a substrate holder which is subjectable to a rotary movement, said substrate being releasably held by said substrate holder;
   at least one liquid supply system for applying a liquid on at least a part of said first side of said substrate;
   at least one gaseous substance supply system for applying a gaseous substance on said first side of said substrate; and
   said gaseous substance supply system and said liquid supply system being positioned such that said gaseous substance is applied closer to the center of said rotary movement of said substrate holder than said liquid.

2. An apparatus as recited in claim 1, further comprising a chamber wherein said substrate holder is positioned, said chamber being designed in a manner to avoid back splashing of said liquid on said first side of said substrate.

3. An apparatus as recited in claim 1, where said gaseous substance supply system comprises at least one nozzle for applying said gaseous substance on said first side of said substrate and said liquid supply system comprises at least one nozzle for applying said liquid on said part of said first side of said substrate, said nozzles are positioned such that said gaseous substance is applied closer to the center of the rotary movement of the substrate holder than said liquid.

4. An apparatus for removing liquid from at least one surface of at least one substrate, said apparatus comprising:
   a substrate holder which is subjectable to a rotary movement, said substrate being releasably held by said substrate holder;
   at least one liquid supply system for applying a liquid on at least a part of said surface of said substrate;
   at least one gaseous substance supply system for applying a gaseous substance on said surface of said substrate; and
   said gaseous substance supply system and said liquid supply system being positioned such that said gaseous substance is applied closer to the center of said rotary movement of said substrate holder than said liquid,
   where said gaseous substance supply system comprises at least one nozzle for applying said gaseous substance on said surface of said substrate and said liquid supply system comprises at least one nozzle for applying said liquid on said part of said surface of said substrate,
   where said nozzles are mounted on an arm, said arm being movable relative to said substrate holder.

5. An apparatus for removing a liquid from a first side and a second side of at least one substrate, said apparatus comprising:
   a substrate holder which is subjectable to a rotary movement, said substrate being releasably held by said substrate holder;
   a first and a second liquid supply system, said first liquid supply system for applying a liquid on at least a part of said first side of said substrate and said second liquid supply system for applying a liquid on at least a part of said second side of said substrate;
   a first and a second gaseous substance supply system, said first gaseous substance supply system for applying a gaseous substance on said first side of said substrate and said second gaseous substance supply system for applying a gaseous substance on said second side of said substrate; and
   said first gaseous substance supply system and said first liquid supply system being positioned such that said gaseous substance is applied closer to the centre of said rotary movement of said substrate holder than said liquid, and said second gaseous substance supply system and said second liquid supply system being positioned such that said gaseous substance is applied closer to the centre of said rotary movement of said substrate holder than said liquid.

6. An apparatus as recited in claim 1, wherein said gaseous substance supply system supplies gaseous substance, at least a part of the time, simultaneously with and said liquid supply system supplying liquid.

7. An apparatus as recited in claim 1, wherein the substrate holder rotates in a range of 2 to 40 revolutions per second.

8. An apparatus as recited in claim 1, wherein said substrate has two sides, the first side and a second side,
   wherein the liquid supply system supplies liquid to at least a part of the first side and at least a part of the second side of said substrate, and
   wherein the gaseous supply system supplies gaseous substance to at least a part of the first side and at least a part of the second side of said substrate.

9. An apparatus as recited in claim 1, wherein said gaseous substance is supplied adjacent to said liquid.

10. An apparatus as recited in claim 1, wherein said substrate has an outer edge, and
    wherein said gaseous substance and liquid are supplied to the substrate in a direction to said outer edge of the substrate.

11. An apparatus as recited in claim 1, wherein the gaseous and liquid supply systems and the substrate holder move relative to one another.

12. An apparatus as recited in claim 11, wherein the gaseous supply system and the liquid supply system move relative to the substrate holder.

13. An apparatus as recited in claim 12, where said gaseous substance supply system comprises at least one nozzle for applying said gaseous substance on said surface of said substrate,
    wherein said liquid supply system comprises at least one nozzle for applying said liquid on said part of said surface of said substrate, and
    wherein said nozzles move relative to the substrate holder.

14. An apparatus as recited in claim 1, further comprising a megasonic energy generator for agitating the liquid in said liquid supply system.

15. An apparatus as recited in claim 14, wherein said megasonic energy generator comprises a liquid nozzle and a generator.

16. An apparatus as recited in claim 15, wherein said generator comprises a transducer and a transmitter.

17. An apparatus as recited in claim 14, further comprising an arm, and wherein at least a portion of the megasonic energy generator is attached to the arm, and wherein a distance between the arm and the first side of the substrate is about 0.5 mm or less.

18. An apparatus as recited in claim 1, wherein said liquid supply system comprises at least one liquid stream for applying said liquid on said part of said first side of said substrate, and wherein said liquid stream and a vector from a center of the substrate to a point where the liquid stream impinges the substrate form an angle which is less than 90°.

19. An apparatus as recited in claim 1, wherein said liquid supply system comprises at least one liquid stream for applying said liquid on said part of said first side of said substrate, and wherein a plane is formed which is perpendicular to said first side of said substrate and which contains a center of the substrate and a point where the liquid stream impinges said first side of said substrate, and wherein at least a portion of said liquid stream is not within the plane formed.

20. An apparatus as recited in claim 19, wherein a second plane is formed which contains the point where the liquid stream impinges said first side of said substrate, which is perpendicular to said first side of said substrate and which forms an angle of between 85° to 90° with said first side of said substrate, wherein said liquid stream is within said second plane formed.

21. An apparatus as recited in claim 1, further comprising at least one additional nozzle for supplying liquid to outer parts of the wafer.

22. An apparatus for removing liquid from at least one surface of at least one substrate, said apparatus comprising:

a substrate holder which is subjectable to a rotary movement, said substrate being held by said substrate holder;

at least one liquid supply system for applying a liquid on at least a part of said surface of said substrate; and at least one gaseous substance supply system for applying a gaseous substance on said surface of said substrate, wherein the gaseous and liquid supply systems and the substrate holder move relative to one another.

23. An apparatus as recited in claim 22, wherein the gaseous supply system and the liquid supply system move relative to the substrate holder.

24. An apparatus as recited in claim 22, wherein said substrate has an outer edge, and wherein said gaseous substance and liquid are supplied to the substrate in a direction to said outer edge of the substrate.

25. An apparatus as recited in claim 22, wherein said gaseous substance supply system supplies gaseous substance, at least a part of the time, simultaneously with and said liquid supply system supplying liquid.

26. An apparatus as recited in claim 22, wherein the substrate holder rotates in a range of 2 to 40 revolutions per second.

27. An apparatus as recited in claim 22 further comprising a megasonic energy generator for agitating the liquid in said liquid supply system.

28. An apparatus as recited in claim 22, wherein said liquid supply system comprises at least one liquid stream for applying said liquid on said part of said first side of said substrate, and wherein said liquid stream and a vector from a center of the substrate to a point where the liquid stream impinges the substrate form an angle which is less than 90°.

29. An apparatus as recited in claim 22 wherein said liquid supply system comprises at least one liquid stream for applying said liquid on said part of said first side of said substrate, and wherein a plane is formed which is perpendicular to said first side of said substrate and which contains a center of the substrate and a point where the liquid stream impinges said first side of said substrate, and wherein at least a portion of said liquid stream is not within the plane formed.

30. An apparatus as recited in claim 29, wherein a second plane is formed which contains the point where the liquid stream impinges said first side of said substrate, which is perpendicular to said first side of said substrate and which forms an angle of between 85° to 90° with said first side of said substrate, wherein said liquid stream is within said second plane formed.

* * * * *